United States Patent
Oda et al.

(10) Patent No.: US 7,274,399 B2
(45) Date of Patent: Sep. 25, 2007

(54) SOLID-STATE IMAGE PICKUP APPARATUS REDUCING FALSE SIGNALS AND A SOLID-STATE IMAGE SENSOR FOR THE SAME

(75) Inventors: Kazuya Oda, Asaka (JP); Katsumi Ikeda, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 770 days.

(21) Appl. No.: 10/637,592

(22) Filed: Aug. 11, 2003

(65) Prior Publication Data
US 2004/0032519 A1 Feb. 19, 2004

(30) Foreign Application Priority Data
Aug. 16, 2002 (JP) .............................. 2002-237422

(51) Int. Cl.
*H04N 3/14* (2006.01)
(52) U.S. Cl. ..................... 348/315; 348/317; 348/322; 348/280
(58) Field of Classification Search ................ 348/249, 348/294, 311–324
See application file for complete search history.

(56) References Cited

U.S. PATENT DOCUMENTS 6,469,290 B1 * 10/2002 Suzuki ................... 250/208.1
6,897,425 B2 * 5/2005 Osada ..................... 250/208.1
2002/0126209 A1 * 9/2002 Yamada et al. ............ 348/219
2004/0017498 A1 * 1/2004 Yamashita et al. .......... 348/315
2004/0046881 A1 * 3/2004 Utagawa ................... 348/294

FOREIGN PATENT DOCUMENTS

JP       10-136391 A      5/1998
JP       2000-152259   *  5/2000

* cited by examiner

*Primary Examiner*—Ngoc-Yen Vu
*Assistant Examiner*—John Morehead
(74) *Attorney, Agent, or Firm*—Birch, Stewart, Kolasch & Birch, LLP

(57) ABSTRACT

A solid-state image sensor for a solid-state image pickup apparatus includes photosensitive cells each having a photosensitive area divided into a main region and a subregion. The subregion is extended to include the position of a virtual pixel. A light-screening layer is formed with optical openings corresponding to the main and subregions, so that light is incident not only to the main region or actual pixel but also to the subregion at the position of the virtual pixel. Spatial information is therefore available even at the position of the virtual pixel in the form of a signal charge.

29 Claims, 11 Drawing Sheets

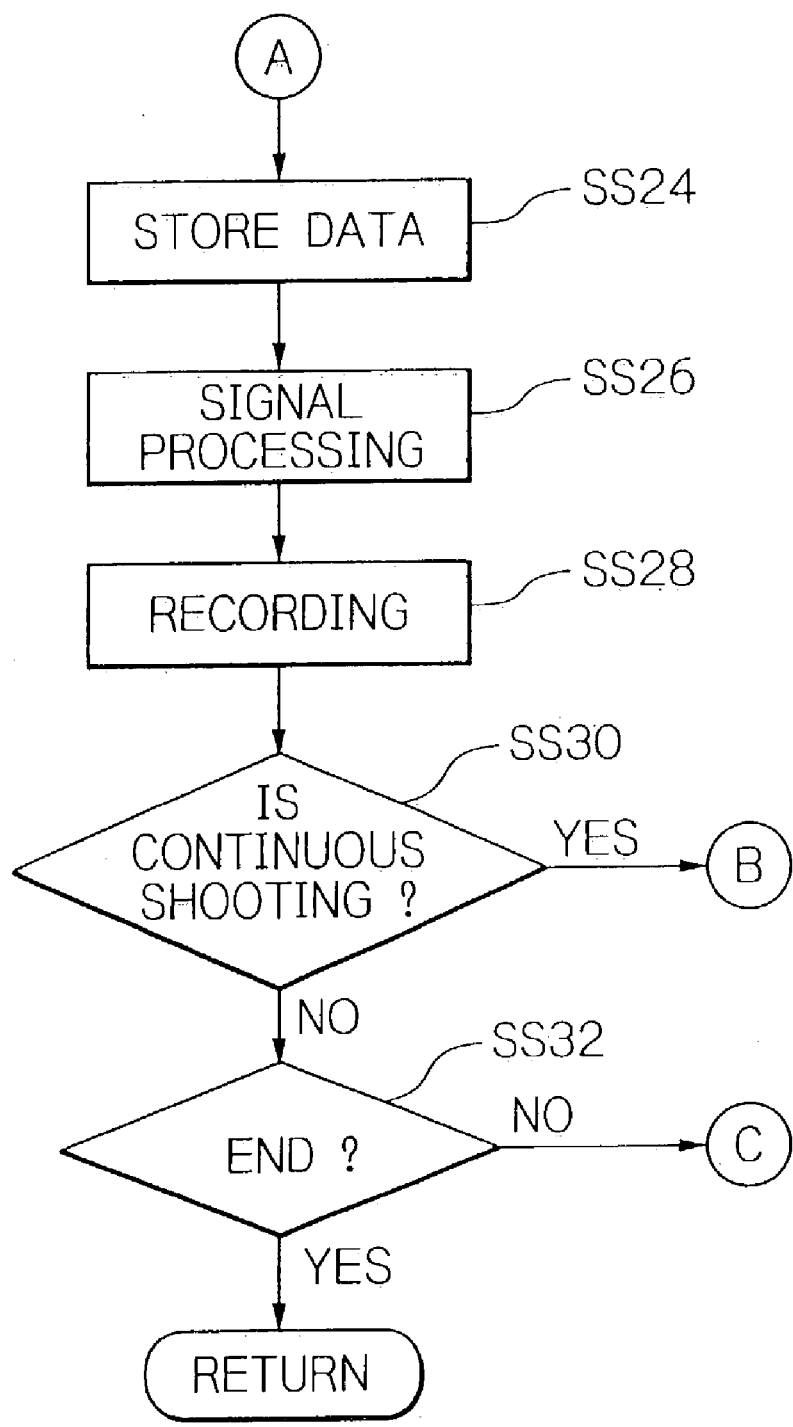

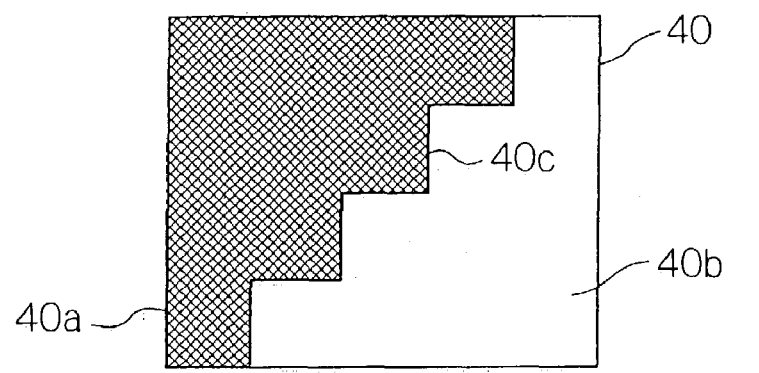
Fig. 10A
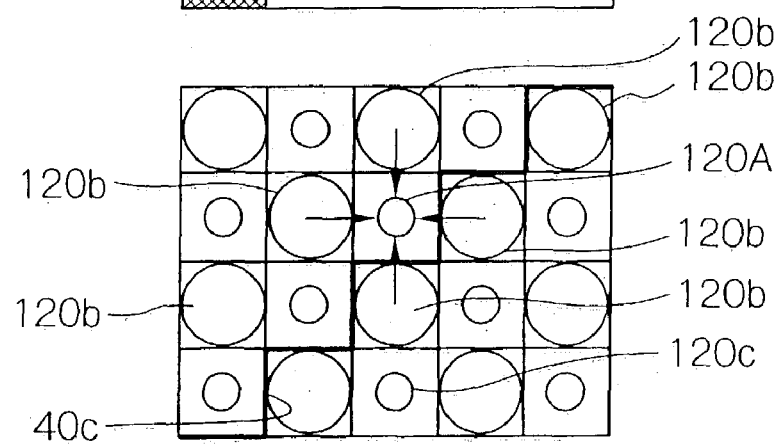
Fig. 10B
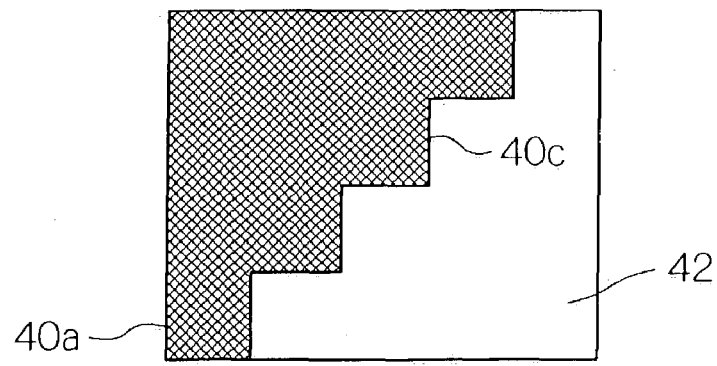
Fig. 10C
Fig. 10D
PRIOR ART
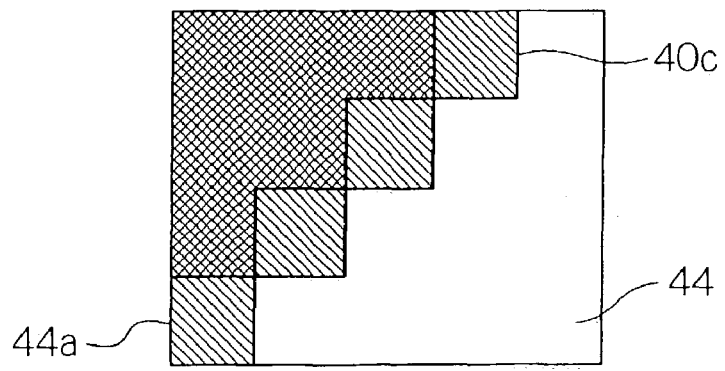

SOLID-STATE IMAGE PICKUP APPARATUS REDUCING FALSE SIGNALS AND A SOLID-STATE IMAGE SENSOR FOR THE SAME

BACKGROUND OF THE INVENTION

1. Field of the Invention

The present invention relates to a solid-state image pickup apparatus including photosensitive cells for electrophotographic transduction arranged in a so-called honeycomb arrangement and a solid-state image sensor included in the image pickup apparatus for generating signal charges with the photosensitive cells.

2. Description of the Background Art

Generally, a solid-state image pickup apparatus is apt to generate moiré and other false signals. Japanese patent laid-open publication No. 136391/1998, for example, discloses a solid-state image pickup apparatus configured to increase the quantity of incident light with densely arranged pixels, thereby promoting efficient receipt of the light. The apparatus taught in this document provides a new structure that optimizes spatial sampling of an image and is referred to as a honeycomb pixel arrangement.

In the honeycomb pixel arrangement, assuming that the distance between nearby pixels on the same row or the same column is a pitch, then pixels around a given pixel each are shifted from the given pixel by half a pitch in the direction of row and/or the direction of column. In a CCD (Charge-Coupled Device) type of solid-state image sensor using the honeycomb pixel arrangement, vertical transfer registers constitute vertical transfer paths extending zigzag in such a manner as to skirt round the pixels. Color filter segments are assigned to, among the pixels, actual pixels that actually exist. The actual pixels, or photosensitive cells, photoelectrically transduce light incident thereto via the color filter segments to generate signal charges having color attributes. The signal charges are then sequentially routed through the vertical transfer registers and horizontal transfer registers, which constitute a horizontal transfer path perpendicular to the vertical transfer path, to an output amplifier. The output amplifier performs Q/V conversion for outputting voltage signals in the form of analog signals.

Subsequently, the analog signals are subjected to signal processing. First, a correlation between pixel data is determined with consideration given to the colors of actual pixels. More specifically, pixel data of the same color and closely correlated to each other are used to estimate pixel data at a virtual pixel, as distinguished from the actual pixels, by calculation and pixel data at actual pixels of different colors. Subsequently, one of such pixel data closer in correlation than the other pixel data is interpolated in the virtual pixel. Such interpolation successfully reduces false signals. Further, the pixel data are successfully broadened in frequency band, enhancing resolution.

It has also been proposed to improve the honeycomb pixel arrangement for further enhancing the resolution of an image and broadening the dynamic range of image signals generated. In accordance with a specific conventional scheme directed toward this object, each of the photosensitive cells has its photosensitive area segmented into a major region and a subregion smaller in area than the former, so that signal charges are readout from the two regions independently of each other. This scheme broadens the dynamic range on the basis of a difference in sensitivity between the main and subregions. In a usual reading mode, the signal charges of the main and subregions are mixed together and read out in the conventional manner.

In the main and subregion scheme stated above, the two regions of the individual photosensitive cell are positioned in a single optical opening. At the light incidence side of the optical opening, a single microlens is positioned so as to focus the incident light onto the photosensitive cell via the optical opening. The spatial information resultant from the focusing is identical with spatial information available with a photosensitive cell having a single region. Because the main and subregions are different in sensitivity from each other due to the difference in area, signals output from the two regions are different from each other for the same spatial information. By combining the signals derived from the two regions by signal processing, it is possible to provide image signals with a broader dynamic range unachievable with the conventional, signal charge-mixing scheme.

Further, in the solid-state image pickup apparatus, a G (green) filter segment is positioned at the light incidence side corresponding to the subregion, so that the subregion outputs a signal close to, among spectral components derived from incident light, a luminance component. By using the luminance component, it is possible to enhance the resolution of an image.

However, optical information conveyed through a microlens is spatially dealt with as identical spatial information, as stated earlier. Consequently, despite that the photosensitive cells are densely arranged, the spatial resolution of the honeycomb pixel arrangement has an upper limit dependent upon the pixel pitch. It follows that an image with resolution higher than the upper limit of spatial resolution would not be rendered without suffering from false signals.

SUMMARY OF THE INVENTION

It is an object of the present invention to provide a solid-state image pickup apparatus capable of realizing spatial resolution higher than the upper limit of spatial resolution particular to the honeycomb pixel arrangement and reducing false signals, and a solid-state image sensor for the same.

A solid-state image sensor of the present invention includes photosensitive cells arranged in bidemensional arrays for converting incident light to signal charges. A plurality of vertical transfer registers are arranged to transfer the signal charges in the vertical direction. A horizontal transfer register disposed perpendicularly to the vertical transfer registers transfers the signal charges input from the vertical transfer registers in the horizontal direction. Assuming a distance between the photosensitive cells, adjoining each other in the vertical and horizontal directions, is a pitch, then the photosensitive cells close to a given photosensitive cell are shifted from the given photosensitive cell by substantially half the pitch. The vertical transfer registers each are formed zigzag between the photosensitive cells adjoining each other in the horizontal direction. Also, assuming that each photosensitive cell actually present is an actual pixel while a virtual photosensitive cell in a vacant region surrounded by actual pixels is a virtual pixel, then a photosensitive region for electrically transducing light incident to a single actual pixel is divided, in a direction in which the virtual pixel is positioned, into a main region and a subregion having a relatively larger area and a relatively smaller area, respectively. The subregion is extended to at least the position of the virtual pixel. A light-screening layer for screening the incident light is formed on the vertical transfer registers and horizontal transfer register except for a first and a second optical opening corresponding to the main region and subregion, respectively. The second optical opening includes the position of the virtual pixel. Read gates are respectively formed in the main region and subregion for reading out the signal charges from the main region and subregion either separately or simultaneously.

A solid-state image pickup apparatus including the above solid-state image sensor is also provided.

BRIEF DESCRIPTION OF THE DRAWINGS

The objects and features of the present invention will become more apparent from consideration of the following detailed description taken in conjunction with the accompanying drawings in which:

FIGS. 8 and 9 are flowcharts demonstrating a subroutine transferred to and from the main routine shown in FIG. 7 and executed in a camera or still picture mode;

FIGS. 10A, 10B and 10C schematically show how the apparatus of FIG. 1 reproduces an image including an oblique boundary;

FIG. 10D shows how the conventional apparatus reproduces an image including an oblique boundary.

DESCRIPTION OF THE PREFERRED EMBODIMENT

Figure 1:
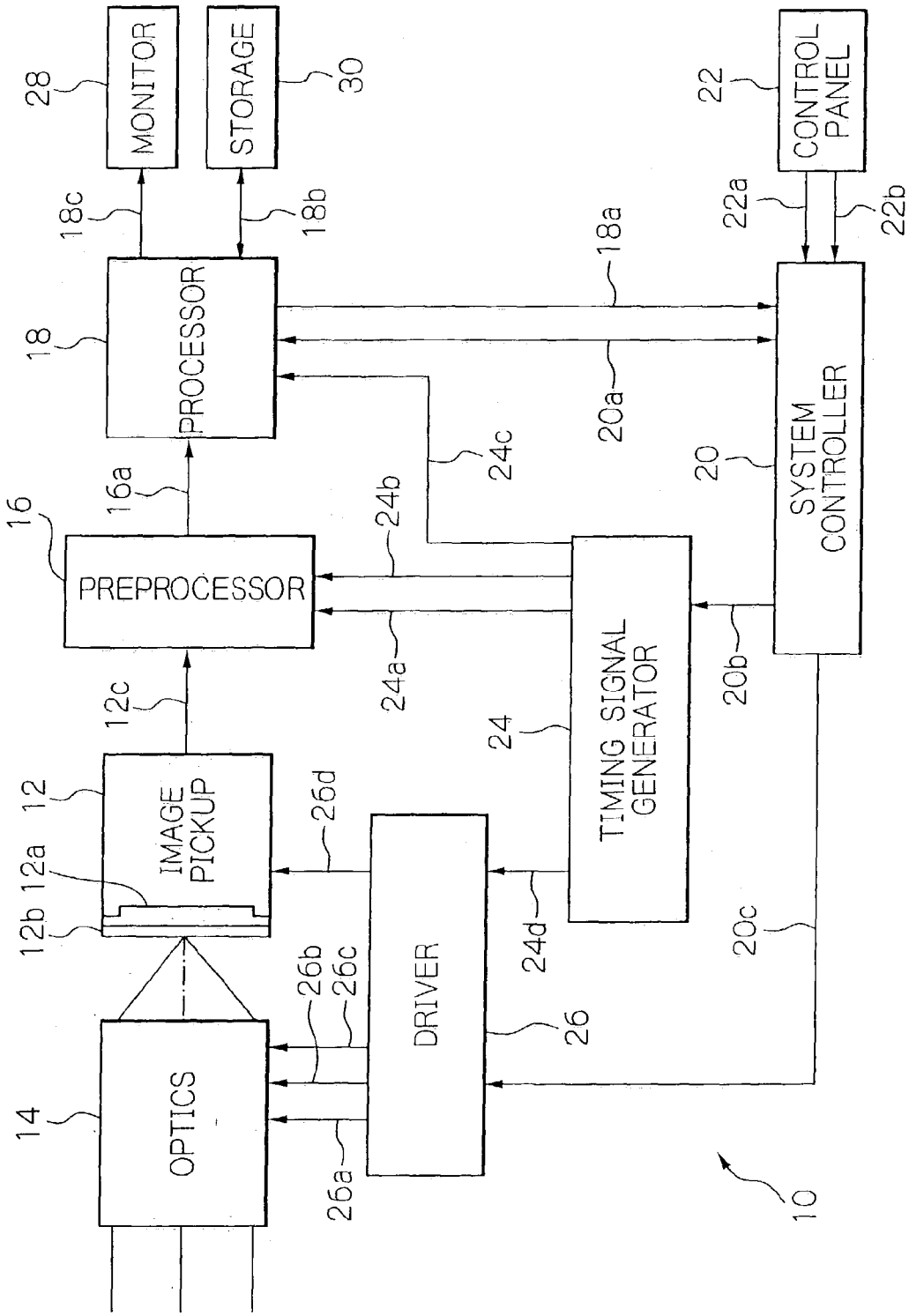
FIG. 1 is a schematic block diagram showing a solid-state image pickup apparatus embodying the present invention.

Referring to FIG. 1 of the drawings, a solid-state image pickup apparatus embodying the present invention is implemented as a digital camera 10 by way of example. Portions of the digital camera not directly relevant to the understanding of the present invention are not shown nor will be described. Signals are designated by reference numerals attached to connect lines on which they appear. As shown, the digital camera 10 includes an image pickup section 12 including a solid-state image sensor 12a, which characterizes the illustrative embodiment. The solid-state image sensor 12a will be described with reference to FIG. 2 specifically before the general construction of the digital camera 10.

Figure 2:
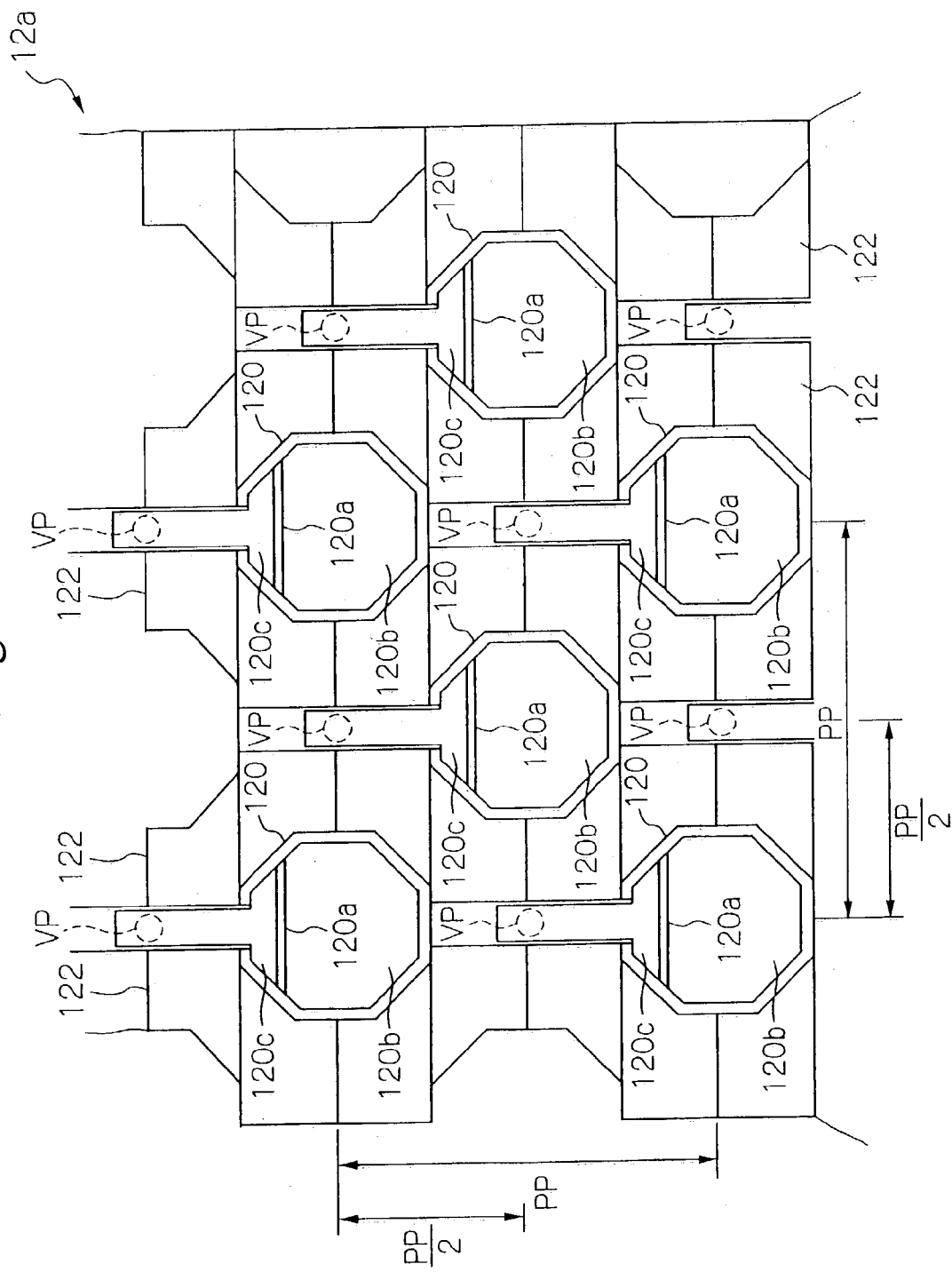
FIG. 2 is a fragmentary front view of a solid-state image sensor embodying the present invention, as seen from the light incidence side, useful for understanding a positional relation between photosensitive cells arranged in a honeycomb pattern.

FIG. 2 is a fragmentary front view showing photosensitive cells 120 arranged in the image sensor 12a, as seen from the side to which light is incident from a subject field. In front of each of the photosensitive cells 120, i.e. on the light incident side, a microlens and a color filter segment are positioned although not shown specifically. As shown, the photosensitive cells 120, each forming a particular, actual pixel, are arranged at a pitch PP in both of the direction of row and the direction of column. To densely arrange the photosensitive cells 120, the cells 120 adjoining a given photosensitive cell 120 each are shifted from the given photosensitive cell 120 by one-half of the pitch PP in the direction of row and the direction of column. This kind of arrangement is generally referred to as a honeycomb pattern.

Each photosensitive cell 120 has its photosensitive area divided into a main region 120b and a subregion 120c by a boundary region 120a, which is implemented as a p-type well to be described later in detail. The main and subregions 120b and 120c respectively occupy a relatively larger area and a relatively smaller area of the photosensitive cell 120. While the boundary region 120a is shown as extending horizontally, it may be adapted to extend obliquely, if desired.

In the illustrative embodiment, the subregion 120c of each photosensitive cell 120 is so extended as to include the position of a virtual pixel, which corresponds to a vacant region where the photosensitive cells 120 are absent. In FIG. 2, the virtual pixels are indicated by dotted circles VP. Vertical transfer registers 122 are arranged zigzag in accordance with the honeycomb pattern of the photosensitive cells 120, and each has a uniform width. Therefore, to extend the individual subregion 120c to the virtual pixel, the subregion 120c is extended vertically, in the imaging plane, i.e. in the figure, with a preselected width from the photosensitive cell 120. While the subregion 120c is shown as extending from the photosensitive cell vertically upward, it may, of course, extend vertically downward.

Figure 3:
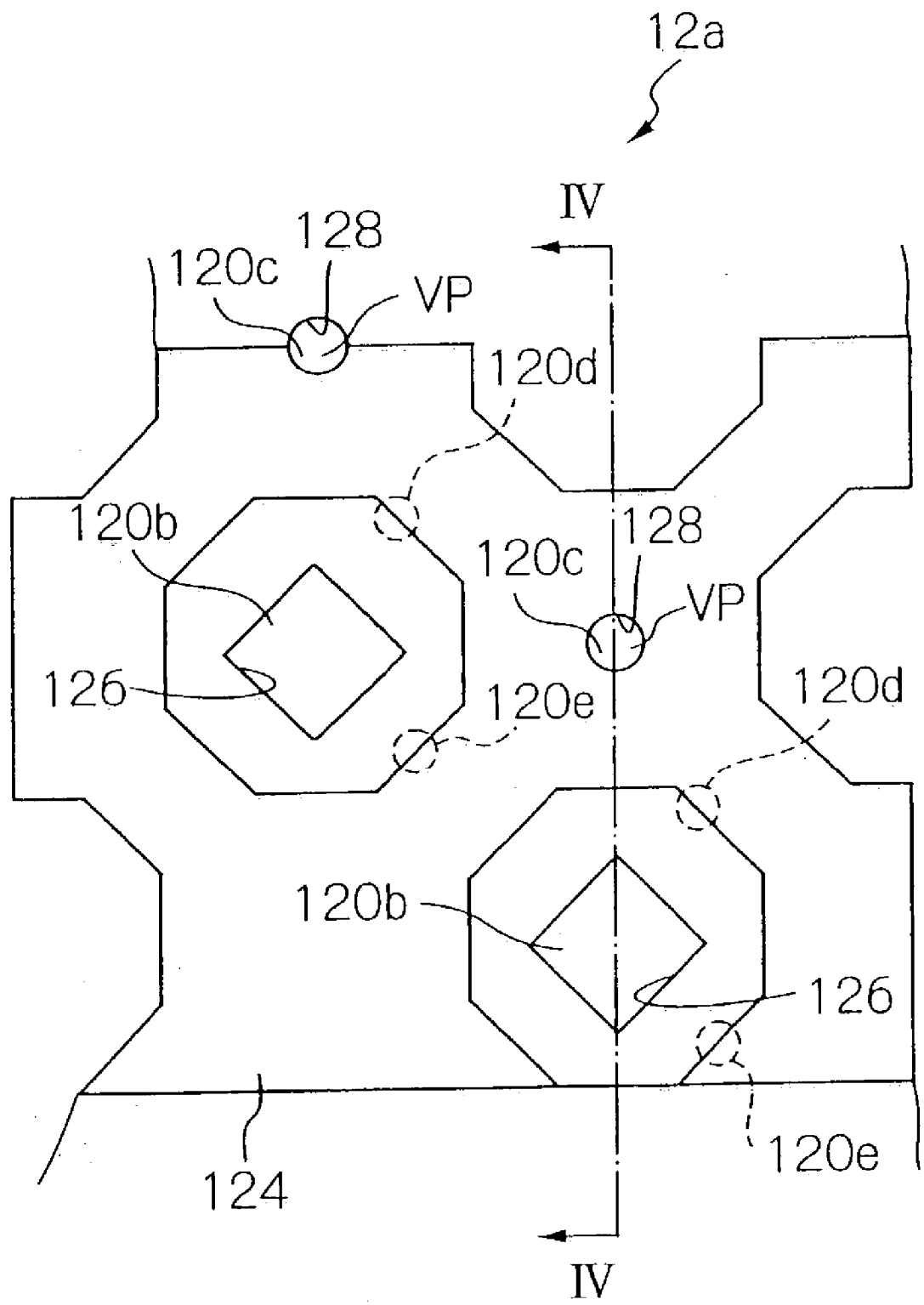
FIG. 3 is a fragmentary view of the image sensor of FIG. 2, as seen from the light incidence side, specifically showing a light-screening layer and optical openings assigned to the photosensitive cells.

As shown in FIG. 3, the image sensor 12a, inclusive of part of the individual photosensitive cell 120 and the vertical transfer registers 122, is generally covered with a light-screening layer 124, which is formed of, e.g. tungsten. The light-screening layer 124 is formed with optical openings 126 and 128 cut to align with the main regions 120b and subregions 120c, respectively. More specifically, each optical opening 126 is configured to allow light to be incident to the main region 120b of the individual photosensitive cell 120, but not to the subregion 120c adjoining the boundary region 120a. Each optical opening 128 corresponds in position only to part of the subregion 120c including the virtual pixel VP.

Figure 4:
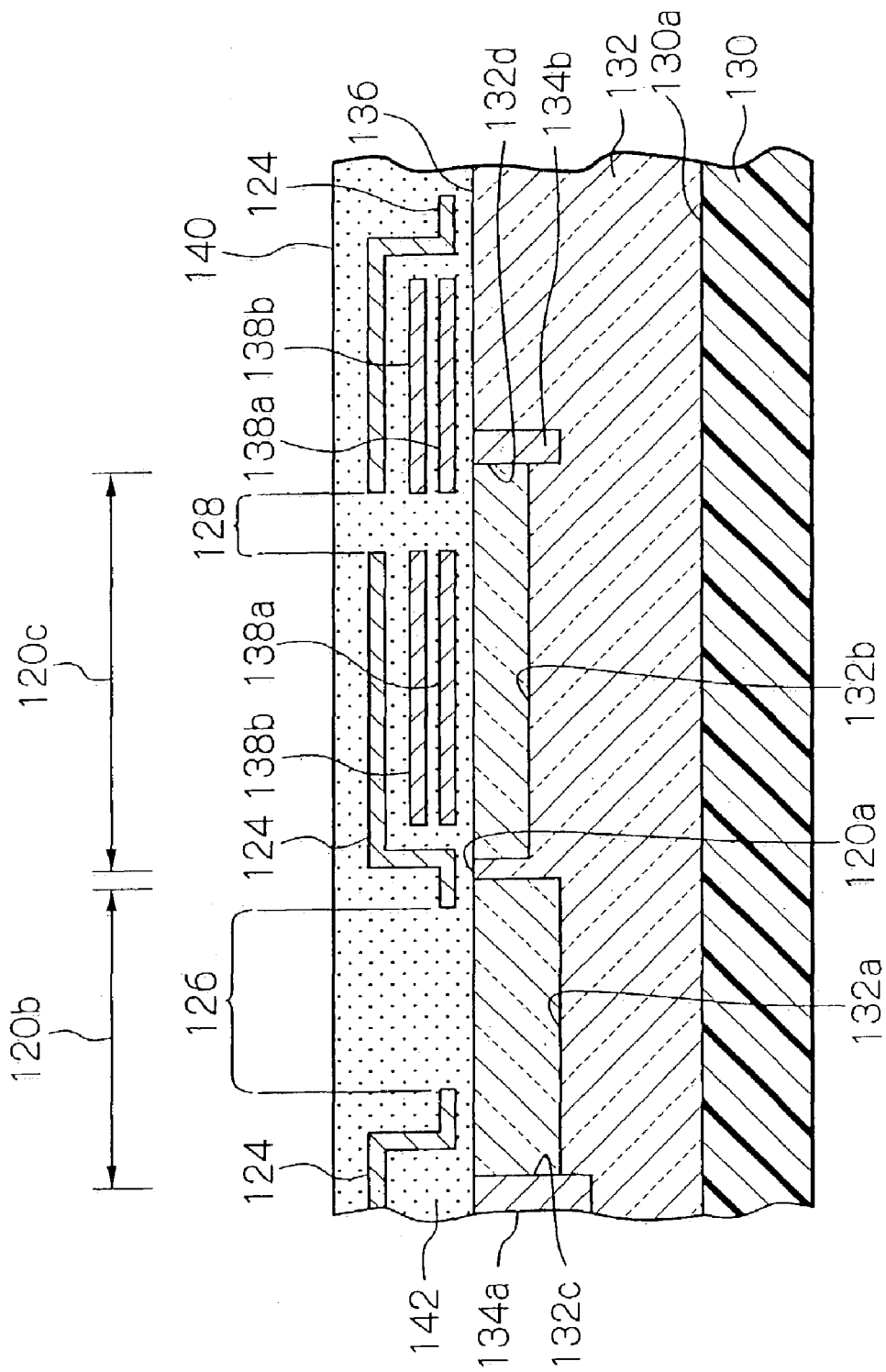
FIG. 4 shows a partial section of the image sensor along line IV-IV of FIG. 3.

As shown in FIG. 4, which shows a fragmentary section along line IV-IV of FIG. 3, the image sensor 12a includes an n-type semiconductor substrate 130 and a p-type well layer 132 formed on the upper primary surface 130a of the substrate 130 in the embodiment. In the well layer 132, a deep well 132a and a shallow well 132b are formed and assigned to the main and subregions 120b and 120c, respectively. The gap between the deep well 132a and the shallow well 132b forms the boundary region or p-type well 120a. Because independent photosensitive cells 120 are absent in the individual photosensitive cell 120, an independent channel stopper, for example, does not have to be positioned in the photosensitive cell 120, so that the photosensitive cell 120 is simpler in structure.

On the lower wall or left side wall 132c of the well 132a in the figure, a channel stop region 134a is formed in order to electrically isolate the photosensitive cell 120 from the vertical transfer register 122 adjoining it. Likewise, on the upper wall 132d or right sidewall of the well 132b, a channel stop region 134b is formed for electrically isolating the photosensitive cell 120 from the vertical transfer register 122. In the wells 132a and 132b, n-type regions are formed constituting the main and subregions 120b and 120c. The top of the stack described so far forms a smooth surface 136.

Subsequently, a silicon oxide layer or similar insulation layer, not shown, is formed on the smooth surface 136. In the insulation layer, transfer electrodes 138a and 138b are formed which are formed of polycrystalline silicon. The transfer electrode 138a is configured to cover the vertical transfer register although not shown specifically. Another insulation layer, e.g. a silicon oxide layer and the transfer electrodes 138b are sequentially formed on the transfer electrodes 138a in this order in such a manner as to cover the vertical transfer register.

The light-screening layer 124 covers the main region 120b except for the optical opening or light incident region 126 and covers the subregion 120c except for the optical opening 128 that includes the position of the virtual pixel. The top of the stack thus completed forms a smooth surface 140. Between the smooth surfaces 136 and 140, an interlayer insulation layer 142 is formed which is implemented by phosphorous silicate glass.

With the above configuration, the image sensor 12a can produce spatial information relating to different positions from the main and subregions 120b and 120c at the same time when subjected to one time of exposure. In fact, as for the position of the virtual pixel VP, if a photosensitive cell should be newly formed in a region conventionally occupied by the vertical transfer register 122, then it would be necessary to form not only a photosensitive region but also a read gate and an electrode. By contrast, the illustrative embodiment provides the main and subregions 120b and 120c of each photosensitive cell 120 with respective read gates or opening/closing means and can effectively use the structure of the conventional photosensitive cell in which the subregion 120c is not extended in the vertical direction. Therefore, the manufacturing processes of the image sensor 12a of the illustrative embodiment may be modified only in terms of the process masks designed for the subregion 120c extending in the vertical direction, the optical opening 128 of the subregion 120c and the light-screening layer 124.

Figure 5:
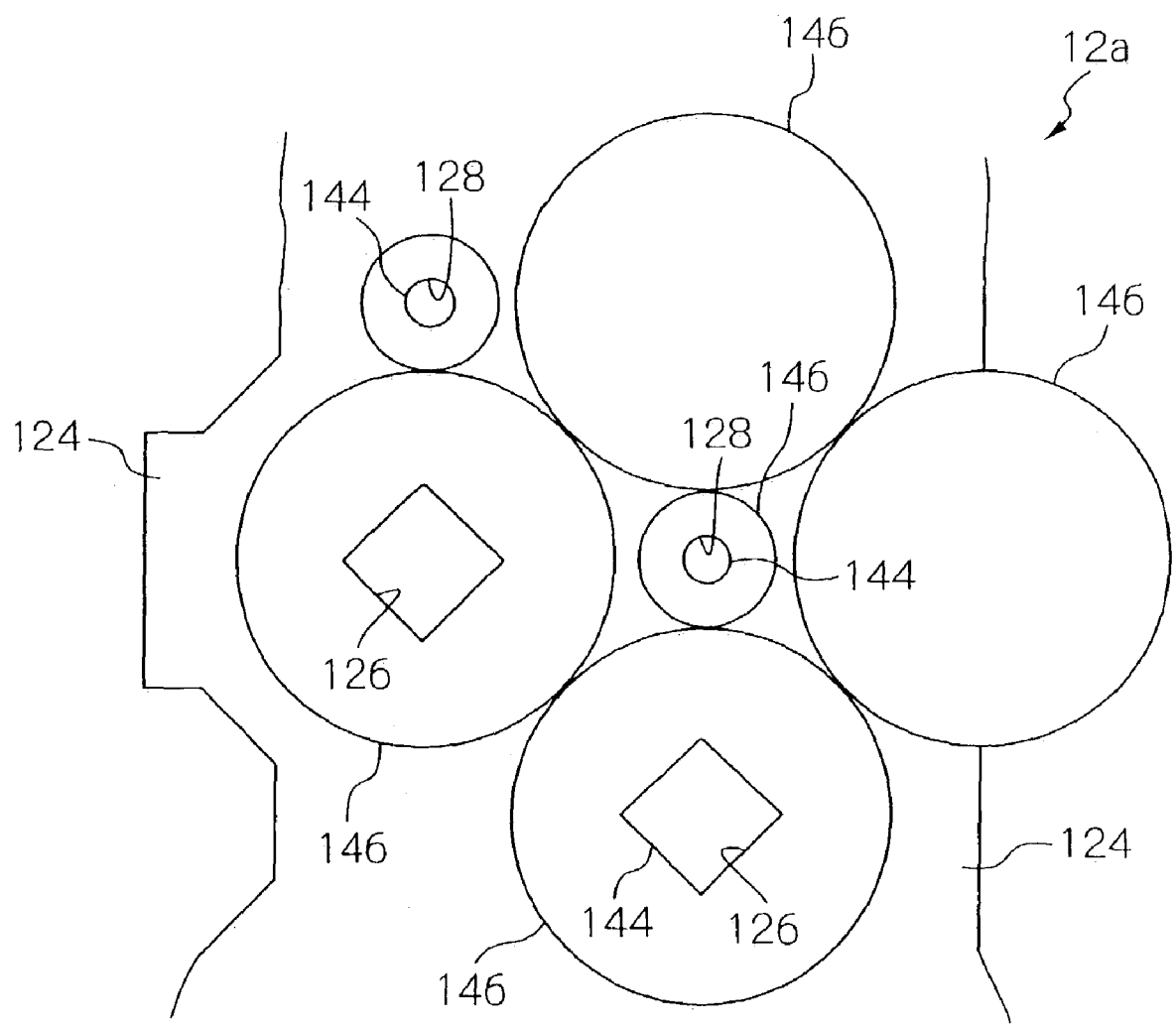
FIG. 5 is a fragmentary front view, as seen from the light incidence side, showing color filter segments and microlenses associated with the image sensor shown in FIG. 3.

As shown in FIG. 5, color filter segments 144 are formed on the smooth surface 140 in such a manner as to cover at least the optical openings 126 and 128 of the main and subregions 120b and 120c of the individual photosensitive cell 120. The color filter segments 144 are of either one of primary color and complementary color systems. The color filter segments 144 assigned to the main and subregions 120b and 120c may be of the same color. In the latter case, signal charges are read out from the regions 120b and 120c simultaneously and mixed with each other, thereby allowing the dynamic range of each photosensitive cell 120 to be broadened.

The color filter segment assigned to the subregion 120c may be implemented as a green (G) segment without regard to the color of the associated main region 120b for the purpose of reducing the color mixture of an image. Further, the color filter segment 144 at the optical opening 128 may be replaced with an optically transparent member. Therefore, when white (W) light is incident to the subregion 120c, it can be effectively used with a minimum of attenuation despite the narrow area of the subregion 120c. It follows that luminance data at the position of the virtual pixel can be accurately generated.

Microlenses 146 are formed on the color filter segments 144, and each is assigned to one of the optical openings 126 and 128 of the individual photosensitive cell 120. The microlenses 146 are formed of, e.g. a resist material. As shown in FIG. 5, a particular microlens 146 may be assigned to each of the main and subregions 120b and 120c in dependence upon the sectional area of the optical opening 126 or 128 formed therein.

In the image sensor 12a, light incident to the main and subregions 120b and 120c through the openings 126 and 128, respectively, is photoelectrically transduced thereby. After exposure, signal charges generated in the main and subregions 120b and 120c are read out to the vertical transfer register 122 associated therewith either independently of each other or at the same time (mixture). The two transfer electrodes 138a and 138b, for example, are formed in each photosensitive cell 120. When read gates 120d and 120e in FIG. 3 are driven independently of each other, the signal charges generated in the main and subregions 120b and 120c are read out through the read gates 120d and 120e independently of each other. At this instant, the signal charge output from the subregion 120c is dealt with as if it were directly output from the position of the virtual pixel VP.

More specifically, the photoelectric signal charges generated in the main regions 120b of the photosensitive cells 120 are read out to the vertical transfer registers 122 first. The signal charges thus transferred and stored in the vertical transfer registers 122 are then sequentially transferred line by line from the registers 122 toward a horizontal transfer register, not shown. Through the horizontal transfer register, a line of signal charges are shifted t to be sequentially delivered therefrom to an output amplifier, not shown, which in turn effects Q/V conversion on the charges and then output electric signals. Thereafter, the signal charges are read out from the subregions 120c to the vertical transfer registers 122, routed through the above-mentioned path, and then output after Q/V conversion in a similar way. The signal read-out sequence described above is adopted in consideration of the fact that the saturated amount of charges noticeably attenuates, after shut from the incident light, in the signal charges derived from the main region 120b.

Figure 6:
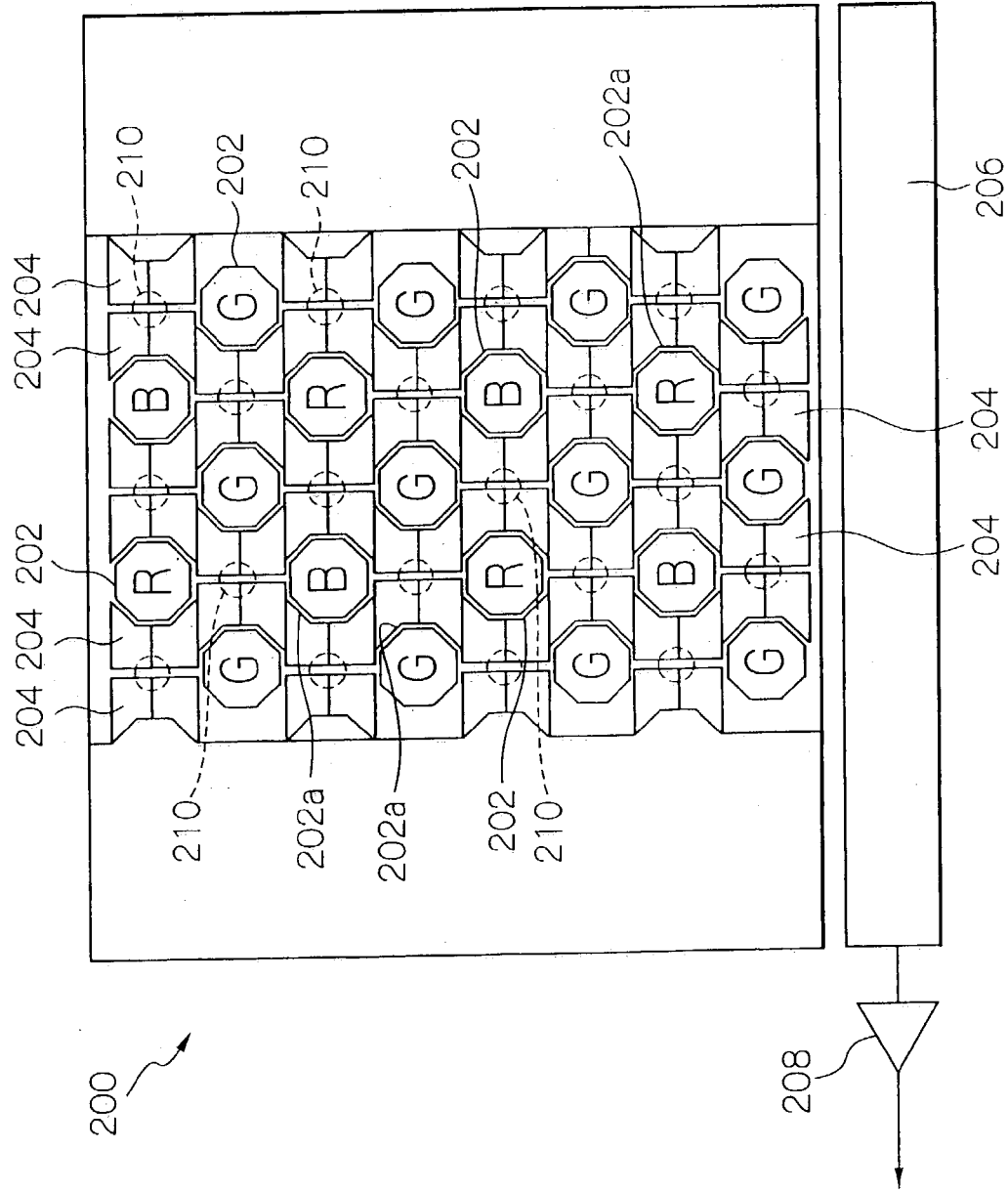
FIG. 6 shows part of a conventional solid-state image sensor having a honeycomb pattern.

FIG. 6 shows a conventional solid-state image sensor 200. As shown, the image sensor 200 includes photosensitive cells 202 bidimensionally arranged in a honeycomb pattern, vertical transfer registers 204 extending zigzag, horizontal transfer registers 206, and an output amplifier 208. Each photosensitive cell 202 may be divided into a main and a subregion, in which case signal charges read out from the two regions are regarded as conveying spatial information output from a single region. The spatial information is, even with respect to the divided cells, identical with what is conveyed when consideration is given to a single photosensitive cell 202. Each of the photosensitive cells 202 has its photosensitive area covered with a particular color filter segments 202a. In FIG. 6, the color filter segments 202a are arranged in a G square, RB full-checker pattern in which a G segment is arranged in a square lattice pattern while red (R) and blue (B) segments are arranged in a full-checker pattern.

When the image sensor 200 is exposed with incident light from a subject field, the incident light is converted to signal charges by the photosensitive cells 202, readout to the vertical transfer registers 204 in the field shift fashion, and then transferred to the horizontal transfer register 206. Subsequently, the signal charges are driven toward the output amplifier 208 along the horizontal transfer registers 206 at higher speed. The output amplifier 208 converts the consecutive signal charges to analog voltage signals by Q/V conversion while outputting the voltage signals. Spatial information particular to each signal charge is derived from the position of a photosensitive cell. In an image pickup apparatus using the image sensor 200, pixel data 210 of virtual pixels are calculated by signal processing as spatial information in order to enhance resolution. More specifically, to estimate the pixel data 210 of each virtual pixel, pixel data of actual pixels (photosensitive cells) surrounding the virtual pixel are subject to arithmetic averaging or weighted averaging.

The image sensor 12a of the illustrative embodiment allows part of each subregion 120c to be positioned as an actual pixel, contrarily to the conventional image sensor 200 described above. The image sensor 12a therefore not only obviates the need for the conventional processing for estimating pixel data for virtual pixels, but also makes spatial information more accurate. By using the accurate spatial information, it is possible to reduce false signals to appear in the resulting image for thereby further enhancing resolution over the limit of interpolation.

Reference will be made to FIG. 1 for describing the general construction of the digital camera 10 including the image sensor 12a. The digital camera includes optics 14, the image pickup section 12, a preprocessor 16, a signal processor 18, a system controller 20, a control panel 22, a timing signal generator 24, a driver 26, a monitor 28, and a storage 30 which are interconnected as illustrated. The optics 14 includes lenses, a zoom mechanism, an iris control mechanism, an AF (Automatic Focus) control mechanism, and a shutter mechanism although not shown specifically.

The zoom mechanism controls the angle of viewing a scene to be picked up while the AF mechanism automatically shifts the lenses to focus the camera 10 on a desired subject in the scene. A particular motor is assigned to each of the zoom mechanism and AP control mechanism for shifting the above lenses and is driven by a drive signal 26a fed from the driver 26.

The iris control mechanism, or AE (Automatic Exposure) control mechanism, is adapted for adjusting the quantity of incident light and turns the iris ring in response to a drive signal 26b fed from the driver 26. The iris ring causes blades thereof to partially overlap each other and form a round iris or lens opening, so that an incident light beam is restricted by the iris. Alternatively, the iris control mechanism may be implemented as a mechanical shutter built in the lenses of the optics 14.

The mechanical shutter prevents light from being incident to the image pickup section 12 except for the exposure time of image shooting and functions to define an exposure time from the start to the end of exposure. The mechanical shutter may be implemented as a focal plane shutter customary with a single-lens reflex camera and configured to cause a shutter screen to run vertically or horizontally for thereby effecting slit exposure. Alternatively, the mechanical shutter may be implemented as a lens shutter, as mentioned above. In either case, the mechanical shutter selectively opens or closes in response to the drive signal 26c.

The image pickup section 12 includes the image sensor 12a and an optical low-pass filter 12b. The image sensor 12a is implemented by CCDs to serve the previously stated function in response to drive signals 26d from the driver 26. The drive signals 26d include a horizontal drive signal ØH, a vertical drive signal ØV, and an OFD (Over Flow Drain) signal in the operation mode of the image sensor 12a. The low-pass filter 12b limits the spatial frequency of incident light to a range below the Nyquist frequency.

In the illustrative embodiment, in a camera or still picture mode, signal charges generated by the photosensitive cells 120 during exposure are read out to the vertical transfer registers 122 through the read gates 120d and 120e. The signal charges are then vertically transferred from the vertical transfer registers 122 to the horizontal transfer register in a line shift way and then horizontally transferred to the horizontal transfer register. The output amplifier, implemented as an FDA (Floating Diffusion Amplifier), executes Q/V conversion on the consecutive signal charges output from the horizontal transfer register. The resulting analog voltage signals 12c are fed from the image sensor 12a to the preprocessor 16. It is to be noted that the signal charges are read out independently of each other in the order stated earlier.

In a movie mode, the signal charges may be read out from the photosensitive cells 120 to the vertical transfer registers 122 at the same time. Such simultaneous reading is allowable only in an application in which the color segments formed on the main and subregions 120b and 120c of the individual photosensitive cell 120 are of the same color.

The camera mode and movie mode each are preceded by a photometry mode. In an AE operation in the photometry mode, only when the system-controller 20 determines that integrated values fed thereto from the signal processor 18 are representative of high luminance, the system controller 20 causes the image sensor 12a to develop signal charges only from the subregions 120c. In this case, the signal charges are read out without regard to the color of the color filter segments assigned to the subregions 120c.

In an AF/AE operation in the photometry mode, if the signal charges of the main and subregions 120b and 120c are read out separately from each other in accordance with the odd/even-numbered line subject to vertical thinning, then information of different degrees of sensitivity can be read out by one time of reading. Further, assuming that two horizontal transfer paths implemented by transfer registers, not shown, are available, then the signal charges of the same color are mixed in a line shift manner during horizontal blanking period. As a result, in the G square, RB full-checker pattern, the image sensor 12a executes, e.g. vertical one-fourth thinning that mixes signal charges of the same color, thereby promoting high-speed signal charge reading. The analog signals 12c thus subjected to Q/V conversion are fed from the image pickup section 12 to the preprocessor 16.

The preprocessor 16 includes a CDS (Correlated Double Sampling) circuit, a GCA (Gain-Controlled Amplifier), and an ADC (Analog-to-Digital Converter) although not shown specifically. The CDS circuit and AD converter respectively receive CDS pulses 24a and a conversion clock signal 24b from the timing signal generator 24. The preprocessor 16 cancels noise contained in the input analog voltage signal 12c, shapes the wave of the resulting noise-free voltage signal and then digitizes the wave-shaped voltage signal, outputting image data 16a. The image data 16a thus output all are delivered to the signal processor 18.

The signal processor 18 includes a signal generating circuit, a memory, gamma correcting circuit, an exposure value calculating circuit, a pixel interpolating circuit, a color difference matrix processing circuit, and a compressing/expanding circuit although not shown specifically. The signal processor 18 receives a control signal 20a from the system controller 20. The signal generating circuit operates in response to the control signal 20a and includes a PLL (Phase-Locked Loop) capable of generating a plurality of different frequencies. More specifically, the signal generating circuit multiplies the oscillation frequency of an oscillator, or reference clock, to generate a plurality of clock signals each having a particular frequency. The clock signals are selectively fed to the system controller 20 and timing signal generator 24.

The timing signal generator 24 generates timing signals derived from a basic clock and delivers them to the signal processor 18. The timing signals include a horizontal synchronizing signal HD, a vertical synchronizing signal VD and clock signals meant for various sections, which will be described later.

The image data 16a output from the preprocessor 16 are input to the memory and temporarily stored therein. In the illustrative embodiment, the memory has two areas for respectively storing image data output from the main regions 120b and image data output from the subregions 120c. The memory uses the two areas to rearrange the input image data in consideration of the positions of the photosensitive cells. The memory should preferably be implemented by a nonvolatile memory to cope with repeated read-out.

In the movie mode, image data derived from signal charges, which are thinned down to, e.g. one-fourth in the vertical direction, are input to the memory. The image data thus stored in the memory may be read out while being thinned down in the horizontal direction in order to increase the aspect ratio and reading speed. In this case, too, the image data are so read out as not to disturb the original color arrangement or pattern. The image data read out from the memory are fed to the gamma correcting circuit.

The gamma correcting circuit executes gamma correction on the input image data as part of image preprocessing by using, e.g. data listed in a lookup table. Further, the image data thus subjected to gamma correction are input to the exposure value calculating circuit and pixel interpolating circuit.

The exposure value calculating circuit includes an operating circuit for calculating an F-number, a shutter speed, a white balance (WB) adjusting value, and a tonality correcting value. With the operating circuit, the exposure value calculating circuit calculates integrated values 18a for various parameters on the basis of the input image data and delivers the integrated values 18a to the system controller 20 as parameters. The exposure value calculating circuit may be included in the system controller 20, if desired. In the latter case, the gamma-corrected image data output from the signal processor 18 will be delivered to the system controller 20.

The pixel interpolating circuit generates pixel data to be interpolated. More specifically, because the image pickup section 12 uses a single color filter, the photosensitive cells included in the image pickup section 12 cannot generate colors other than the colors of the actual color filter segments. To solve this problem, in the camera mode, the pixel interpolating circuit generates pixel data represented in colors other than the colors of the actual color filter segments, feeding the resulting planar image data to the color matrix processing circuit.

The pixel interpolating circuit may additionally function to broaden the frequency band of the generated pixel data. Further, in the illustrative embodiment in which the image pickup section 12 uses the image sensor 12a, it is not necessary to execute estimation or calculation heretofore executed on virtual pixels on the basis of correlation between pixel data. This successfully reduces load on the signal processing. The pixel interpolating circuit interpolates pixel data purely corresponding to primary colors R, G and B. The pixel data corresponding to virtual pixels are from the pixel data actually sensed and therefore more reliable than conventional pixel data, so that a heavier weight should preferably be assigned to such pixel data.

The pixel data at the virtual pixel positions are available from the optical openings 128 of the subregions 120c as actual information. For example, if such pixel data correspond to G data or W (white light) data, then the pixel data can be dealt with as high-frequency luminance data $Y_H$. In this case, the pixel interpolating circuit uses the high-frequency luminance data $Y_H$ instead of luminance data derived from surrounding pixels by estimation, thereby enhancing the accuracy of pixel data at the virtual pixel positions. Even with pixel data having color attributes, it is possible to realize more accurate data level than with estimated image data, allowing the edges, color boundaries and so forth of the resulting image to be accurately rendered. This contributes a great deal to the enhancement of resolution and the reduction of false colors.

The color matrix processing circuit uses the image data fed from the pixel interpolating circuit and predetermined coefficients to generate luminance data Y and color data $C_b$ and $C_r$ by. The luminance data Y and color data $C_b$ and $C_r$ so generated are input to the compressing/expanding circuit. Let these data Y, $C_b$ and $C_r$ be referred to as image data Y/C hereinafter.

The compressing/expanding circuit compresses, in the camera mode or the movie mode, the image data Y/C under, e.g. the JPEG (Joint Photographic coding Experts Group) or the MPEG (Moving Picture coding Experts Group)-1 or MPEG-2 standard. The compressing/expanding circuit stores the compressed image data (Y/C) 18b in the storage 30. Also, the compressing/expanding circuit reads out the image data 18b from the storage 30 and expands them. Expansion is inverse in procedure to compression.

Further, the signal processor 18 transforms the image data generated or the image data Y/C read out and expanded to R, G and B image data 18c and feeds the image data 18c to the monitor 28. The monitor 30 is controlled by a display controller, not shown, to display the imaged at a 18c in the form of a picture.

In an application in which the camera 10 is capable of transferring image data to and from external equipment, the signal processor 18 should preferably include an external I/F (interface) circuit. For the external I/F circuit, use may be made of a PIO (Programmed Input/Output), a UART (Universal Asynchronous Receiver/Transmitter), a USB (Universal Serial Bus) or an I/F based on the IEEE (the Institute of Electrical and Electronics Engineers) 1394 standard.

The PIO is an interface whose input and output are variable on the basis of a program sequence. The UART is a device for use in a serial interface and capable of converting parallel signal input thereto to a serial signal or converting a serial signal received from a serial device to parallel signals. The interface based on the IEEE 1394 standard supports data transfer up to, e.g. 400 Mbps (megabits per second).

The system controller 20 is implemented by a microcomputer or a CPU (Central Processing Unit) for controlling the sections of the camera 10 and sections assigned to digital processing. More specifically, the system controller 20 establishes either one of the camera mode and movie mode in the camera 10 in accordance with a mode signal 22a received from the control panel 22. Also, the system controller 20 generates control signals 20a, 20b and 20c matching with the integrated values 18a in accordance with the mode signal 22a and a trigger signal 22b, which is produced responsively to a shutter release button, not shown, disposed on the control panel 22. The trigger signal 22b defines the timing for image shooting. The control signals 20a, 20b and 20c are fed to the signal processor 18, timing signal generator 24 and river 26, respectively.

The system controller 20 generates the control signal 20a by taking account of control over line interpolation and signal generation in the signal processor 18 and control necessary for signal processing as well. Further, the system controller 20 controls the storing and reading out of image data out in and from the storage 30.

The control panel 20 includes a mode selecting section in addition to the shutter release button. The mode selecting section is operated to select either one of the camera mode and movie mode and delivers the previously mentioned mode signal 22*a* to the system controller 20. The shutter release button has a first and a second stepwise stroke. More specifically, the shutter release conditions the camera 10 for preliminary image pickup when depressed to the first stroke S1 or conditions it for actual image pickup when depressed to the second stroke S2. The control panel 22 may additionally include a zoom select switch and direction keys and may be configured to allow the operator to select conditions viewed on an LCD (Liquid Crystal Display) panel.

The clock signal, not shown, is fed from the signal processor 18 to the timing signal generator 24 as a reference clock signal. The timing signal generator 24 generates timing signals in response to the reference clock signal and control signal 20*b*, which is fed from the system controller 20. The above timing signals include a vertical and a horizontal synchronizing signal, field shift pulses, a vertical and a horizontal transfer signal, an electronic shutter pulse as well as the CDS pulses 24*a* and conversion clock signal 24*b* mentioned earlier. Those timing signals, collectively labeled 24*d* and including the vertical and horizontal synchronizing signals, field shift pulses, vertical and horizontal transfer signals and electronic shutter pulse, are selectively delivered to the driver 26 while the CDS pulses 24*a* and conversion clock signal 24*b* are delivered to the preprocessor 16. The timing signal 24*c* is fed to the signal processor 18.

The driver 26 includes a drive circuit, not shown, for generating the drive signals 26*a* through 26*d* on the basis of the timing signals 24*d* and control signal 20*c* input thereto. More specifically, the driver 26 feeds, in response to the control signal 20*c*, the drive signals 26*a* and 26*b* to the lens system of the optics 14 and iris control mechanism, respectively, for thereby causing them to perform AF control and AE control. Also, the driver 26 delivers the drive signal 26*c* to the mechanical shutter at the image pickup timing defined by the shutter release button, when depressed, causing the mechanical shutter to open and then close.

Further, the driver 26 feeds the drive signal 26*d* to the image sensor 12*a* in response to the timing signals 24*d*. The drive signal 26*d* causes the image sensor 12*a* to store signal charges in the main and subregions 120 band 120*c* of the individual photosensitive cell 120 during exposure time. The signal charges are read out from the main and subregions 120*b* and 120*c* to the vertical transfer registers 122 either independently or simultaneously in accordance with the conditions stated previously. The signal charges are then transferred to the horizontal transfer registers and then converted to analog voltage signals 12*c* via the output amplifier.

The monitor 28, which receives the image data 18*c* from the signal processor 18, is generally implemented by an LC (Liquid Crystal) monitor. An LC controller, not shown, applies a voltage in accordance with the image data 18*c* for switching the orientation of LC molecules in the LC monitor. As a result, the monitor 28 displays the image data 18*c* in the form of a picture. The LC monitor may, of course, be replaced with any other miniature, power-saving display unit, which allows the user to confirm a picture viewed thereon, and saves power.

The storage 30 includes a recording medium for storing the image data fed from the signal processor 18. The recording medium may be implemented by any one of a semiconductor memory, an optical disk, a magnet-optical disk and so forth. In the storage 30, data are stored in or read out from the recording medium by a transducer, such as an optical pickup or the combination of an optical pickup and a magnetic head, matching with the kind of the recording medium and also controlled by the system controller 20.

As stated above, in the illustrative embodiment, the optical opening 128 of the subregion 120*c* of the individual photosensitive cell 120 is formed at the position of a virtual pixel spatially different from the position of the optical opening 126 of the main region 120*b* in accordance with the AE/AF mode and camera or movie mode, so that signal charges are read out from the main and subregions 120*b* and 120*c* either independently or simultaneously. This allows image data at the virtual pixel, which has heretofore been estimated from pixel data at photosensitive cells around the virtual pixel, to be actually produced by photoelectric transduction. It follows that the accuracy of spatial information carried by signals is enhanced, obviating the need for estimation of virtual pixels. A picture derived from such accurate signals includes a minimum of false signals and therefore achieves far higher resolution than conventional.

Figure 7:
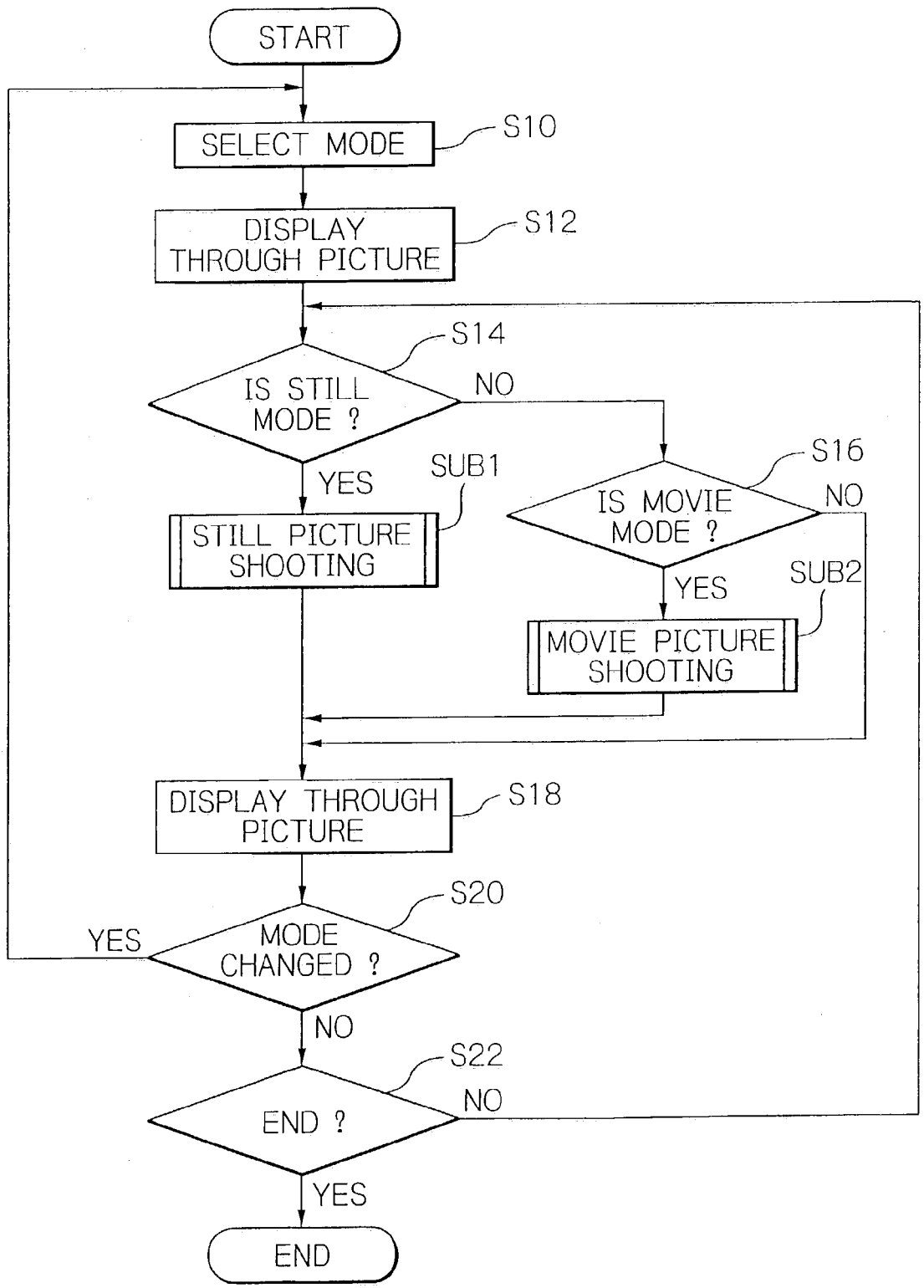
FIG. 7 is a flowchart demonstrating a main routine to be executed by the apparatus of FIG. 1.

A specific operation of the camera 10 will be described with reference to FIG. 7 hereinafter. First, upon the power-up of the camera 10, the system controller 20 initializes the entire camera 10. As shown in FIG. 7, after the initialization, the operator of the camera 10 selects the camera mode or the movie mode on the control panel 22 (step S10). In response, the circuitry of the control panel 22 feeds a mode signal 22*a* representative of the mode selected to the system controller 20. This is followed by through picture display (step S12).

In the step S12, the image data 12*c* output from the image pickup section 12 are input to the signal processor 18, processed thereby, and then displayed on the monitor 28. For the through picture display, the system controller 20 controls the timing signal generator 24 and driver 26 so as to execute AF control and AE control while opening the mechanical shutter. After closing the shutter, the system controller 20 causes signal charges generated in the main and subregions 120*b* and 120*c* of the individual photosensitive cell 120 to be read out to the vertical transfer register 122 at the same time in accordance with the drive timing particular to vertical thinning, thereby mixing the signal charges. For the color filter segments assigned to the main and subregions 120*b* and 120*c*, color filter segments of the same color are used to prevent different colors from being mixed together. Such mixed reading is identical with the reading from the conventional photosensitive cell not divided into two regions.

In an application where the color filter segments are arranged in the G square, RB full-checker pattern, lines are thinned out to one-third or one-fourth in the vertical direction, so that the same relation can be preserved despite vertical thinning. More-specifically, one-third thinning causes one line out of each three lines to be read out while obviating color mixture, and one-fourth thinning takes account of the fact that a line of a given color appears every fourth line. In the illustrative embodiment, the image pickup section 12 photoelectrically transduces incident light and vertically thins out the resulting signal charges to one-third in response to the timing signal 26*d*. The signal charges thus thinned out are output as analog signals 12*c* via the output amplifier and then routed through the preprocessor 16 to the signal processor 18.

The signal processor 18 stores image data 16a output from the preprocessor 16 in the memory thereof. The image data 16a stored in the memory are read out as a movie while being thinned out in the horizontal direction also. The resulting picture thinned out in both of the vertical and horizontal directions is fed to the monitor 28.

While the through picture display described above is under way, the system controller 20 determines whether or not the camera mode is selected (step S14). If the answer of the step S14 is positive (YES), then the system controller 20 transfers the control to the pickup of a still picture, which will be described specifically later as a subroutine SUB1. This is again followed by the through picture display (step S18) If the answer of the step S14 is negative (NO), then the system controller 20 determines whether or not the movie mode is selected (step S16) If the answer of the step S16 is YES, then the system controller 20 transfers its control to the pickup of a movie, which will also be described specifically later as a subroutine SUB2. If the answer of the step S16 is NO, then the system controller 20 again executes the step S18.

After the step S18, when any one of the keys arranged on the control panel 22 is operated by the operator, the system controller 20 determines whether or not the key pressed relates to mode selection (step S20). If the answer of the step S20 is YES, then the system controller 20 determines that the mode is changed, and then returns to the step S10. If the answer of the step S20 is NO, meaning that the key pressed does not relate to mode selection or no keys are operated over a predetermined period of time or waiting time, then the system controller 20 determines whether or not the camera 10 should end operating (step S22).

If the answer of the step S22 is YES, then the system controller 20 ends the operation of the camera 10 to turn off power supply. If the answer of the step S22 is NO, then the system controller 20 returns to the step S14 while preserving the previous pickup mode or mode information. An arrangement may be made such that if no keys on the control panel 22 are depressed over the waiting time, the system controller 20 interrupts the through picture display and automatically restores a stand-by mode while preserving the pickup mode.

The subroutine SUB1 effected in the camera mode will be described with reference to FIG. 8. As shown, when the shutter release button on the control panel 22 is pushed in the first stroke S1, i.e. to its half-depth position (substep SS10), the system controller 20 newly generates, in response to the resulting trigger signal 22b, control signals 20a, 20b and 20c for driving the image pickup section 12 (substep SS12). In response to the control signal 20b, the timing signal generator 24 generates timing signals 24d such that signal charges are read out from the main and subregions 120b and 120c with the even- and odd-numbered, vertically thinned lines being distinguished from each other. On receiving the timing signals 24d, the driver 26 feeds drive signals 26d to the image sensor 12a of the image pickup section 12. Consequently, information on different degrees of sensitivity is simultaneously read out from the image sensor 12a line by line while being vertically thinned out in response to the control signal 20b.

AF/AE control is executed on the basis of the image data 16a produced by digitizing the analog voltage signals 12c for photometry, which are output from the image pickup section 12 (substep SS12). By using the image data 16a, the signal processor 18 causes its estimated value calculating section to generate parameters for AF and AE control. The parameters thus generated, i.e. the integrated values 18a are fed from the signal processor 18 to the system controller 20.

The system controller 20 generates control signals 20a through 20c matching with the integrated values 18a and delivers the controls signals 20b and 20c to the timing signal generator 24 and driver 26, respectively. More specifically, the system controller 20 compares the integrated values 18a with a reference value and generates, if luminance determined by photometry is high, the control signal 20b such that the signal charges are read out only from the subregions 120c of the photosensitive cells 120.

The driver 26 delivers, in response to the control signal 20c and timing signals 24d, drive signals 26a, 26b and 26c for AF/AE control to the zoom mechanism, iris control mechanism and mechanical shutter drive mechanism of the optics 14. With an alternative embodiment, AF/AE control may be executed in accordance with information output from an exclusive sensor assigned to AF/AE control, if desired. Because the operation of the shutter release button in the stroke S1 is occasionally repeated two times or more, the substep SS12 is, of course, repeated every time the above operation of the shutter release button is effected before actual pickup.

After the substep SS12, the shutter release button is operated in the stroke S2, i.e. to its full-depth position (substep SS14). In response to the resulting trigger signal 22b, the system controller 20 causes the image pickup section 12 to start exposure for actual pickup (substep SS16). More specifically, the image pickup section 12 opens the mechanical shutter in response to the drive signal 26c output from the driver 26. The system controller 20 controls exposure time as well on the basis of the integrated values 18a input thereto.

Subsequently, the system controller 20 determines whether or not the exposure time has expired, i.e. exposure has ended (substep SS18). If the answer of the substep SS18 is YES, then the system controller 20 transfers its control to processing for completing exposure (substep SS20) If the answer of the substep SS18 is NO, then the system controller 20 repeats the substep SS18 while causing exposure to continue.

In the step SS20, the mechanical shutter is closed in response to the drive signal 26c output from the driver 26 under the control of the system controller 20, blocking incident light. In the pickup section 12, signal charges dependent upon the quantities of incident light are read out to the vertical transfer registers 122 region by region (whole pixel reading; substep SS22). More specifically, signal charges stored in the main regions 120b are read out before signal charges stored in the subregions 120c in consideration of the attenuating amount of saturation. The signal charges are routed through the vertical transfer paths and horizontal transfer path to the output amplifier and converted to analog voltage signals 12c thereby. The analog signals 12c are then converted to digital signals by the preprocessor 16 and then stored in the memory of the signal processor 18 in the form of image data 16a. The substep SS22 of the subroutine SS1 is transferred to a step SS24 shown in FIG. 9 via a connector A in the figure.

In the step SS24, the image data derived from the signal charges read out from the main and subregions 120b and 120c are respectively written into the two areas of the memory included in the signal processor 18. It should be recalled that the image data produced from the subregions 120c are actual data corresponding to virtual pixels and heretofore obtained only by estimation.

Subsequently, the signal processor 18 executes signal processing on the image data stored in the memory (substep SS26) More specifically, the signal processor 18 sequentially executes gamma correction, pixel interpolation, matrix processing and compression on the image data in this order. Particularly, the image data derived from the subregions 120c are dealt with as high luminance data $Y_H$ at virtual pixel positions during pixel interpolation. The actual luminance data $Y_H$ are higher in level accuracy and reliability than conventional luminance data produced by adding and averaging surrounding pixel data.

The image data 18b compressed by the signal processor 18 are written into the storage 30 (substep SS28). Substantially at the same time, the signal processor 18 may thin out the image data not compressed to deliver pixel data thus produced to the monitor 28.

After the substep SS28, the system controller 20 determines whether or not a continuous shoot command is input to the camera 10, i.e. whether or not the shutter release button on the control panel 22 is continuously pushed in the second stroke S2 (substep SS30). If the answer of the step SS30 is YES, then the procedure returns to the AF/AE control (substep SS12, FIG. 8) via a connector B. If the answer of the step SS30 is NO, meaning that a single shot is selected, then the system controller 20 determines whether or not the camera mode operation should end (substep SS32).

While the decision on the continuous/single shot is effected after recording in the procedure of FIG. 9, the next exposure may be started if all data have already been read out from the image pickup section 12.

Figure 8:
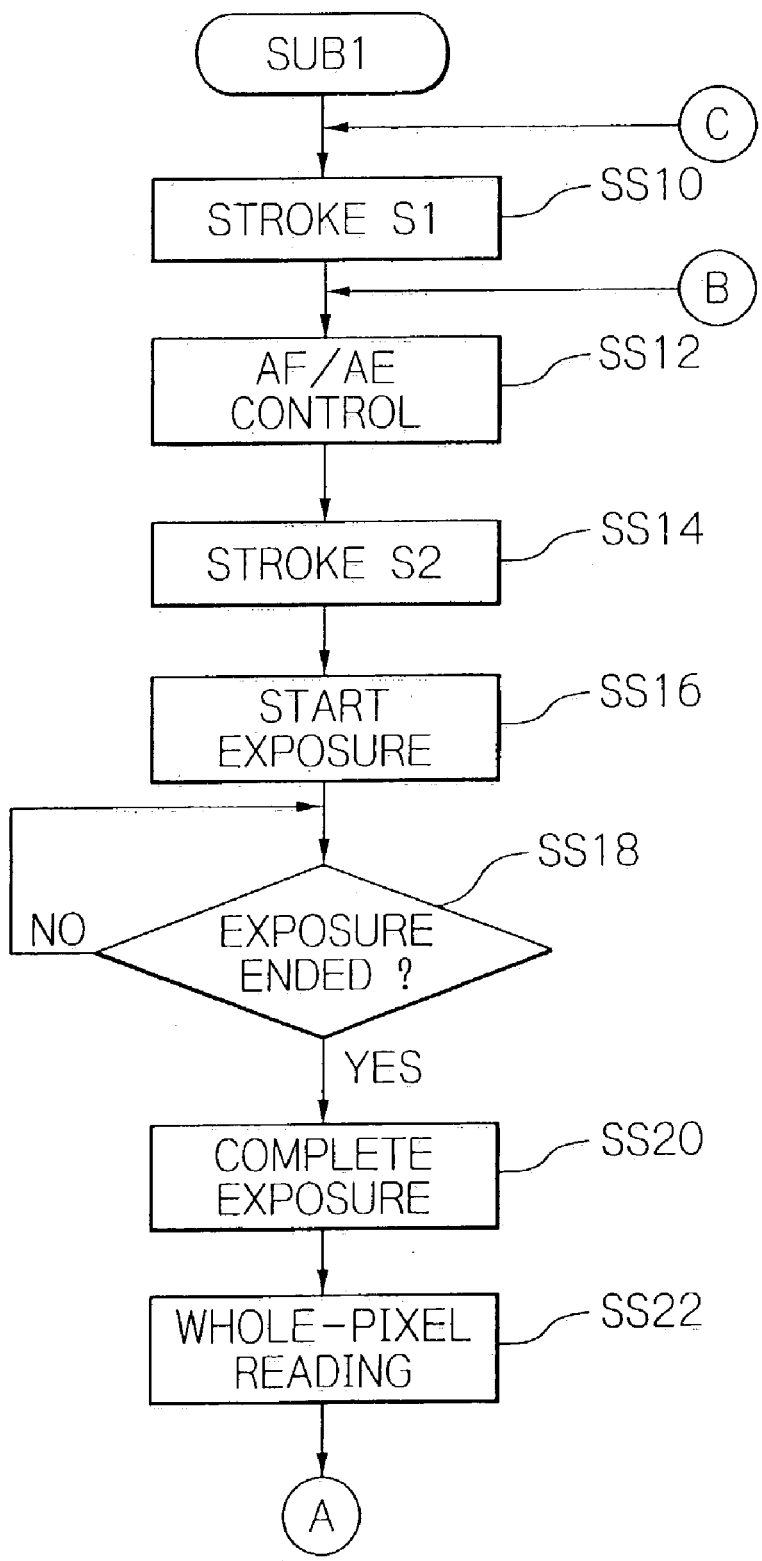

If the answer of the substep SS32 is NO, meaning that the camera mode should be continued, then the procedure returns to the substep SS10, FIG. 8, via a connector C. If the answer of the substep SS32 is YES, then the procedure returns to end the subroutine SUB1.

Why the procedure described above achieves information higher in level accuracy than the conventional procedure will be described more specifically with reference to FIGS. 10A through 10D. FIG. 10A shows a specific subject field 40 in which a black portion 40a, indicated by cross-hatching, and a white portion 40b are separated by a boundary 40c inclined toward the top right stepwise in the figure, i.e. subject field 40. FIG. 10B shows a relation between the subject 40 picked up in the camera mode and the main and subregions 120b and 120c unique to the illustrative embodiment. In FIG. 10B, the main and subregions 120b and 120c are represented by larger solid circles and smaller solid circles, respectively.

In the example shown in FIG. 10B, the still image shooting rendered the subregions 120c lying in the black portion 40a and the subregions 120c lying in the white portion 40b the logical levels ZEROs and ONEs, respectively. At this instant, the subregions 120c located at an area 120A near the boundary 40c take, e.g. ZEROs because of the pixel data actually read out. Therefore, the subregions 120c positioned toward below left in the field 40 the subregion 120A on the boundary 40c take also ZEROs. It has been customary to add and then average the pixel data of two photosensitive cells (actual pixels) 120b that adjoin each other at both sides of the boundary 40c for thereby estimating the levels of virtual pixels adjoining the boundary 40c. The illustrative embodiment makes such estimation unnecessary by using the actual pixel data derived from the subregions 120c as pixel data at virtual pixels. FIG. 10C shows a picture 42 thus attainable with the illustrative embodiment and substantially faithful to the subject 40.

By contrast, it will be seen that when the conventional decision on correlation is used to determine levels at virtual pixels, which are arranged in the honeycomb pattern, correlation does not exist between the horizontal and vertical directions. In this case, a level at a given virtual pixel is estimated by the adding and averaging of four actual pixels 120b around the virtual pixel; the estimated level is 0.5. As for a black-and-white image, the level of 0.5 at the virtual pixel corresponds to gray. FIG. 10D shows a picture 44 resulting from such a conventional procedure. As shown, in the picture 44, gray regions 44a, indicated by hatching, are formed around the boundary 40c at the positions of the virtual pixels, disfiguring the picture, i.e. lowering the resolution thereof.

In short, even when a picture includes an oblique boundary like a partly highlighted picture, the illustrative embodiment can accurately render the contour of subjects in the picture without forming any gray regions. Further, by effectively using the subregions 120c, the illustrative embodiment can reduce false color signals even with a color picture for thereby enhancing color resolution.

Figure 11:
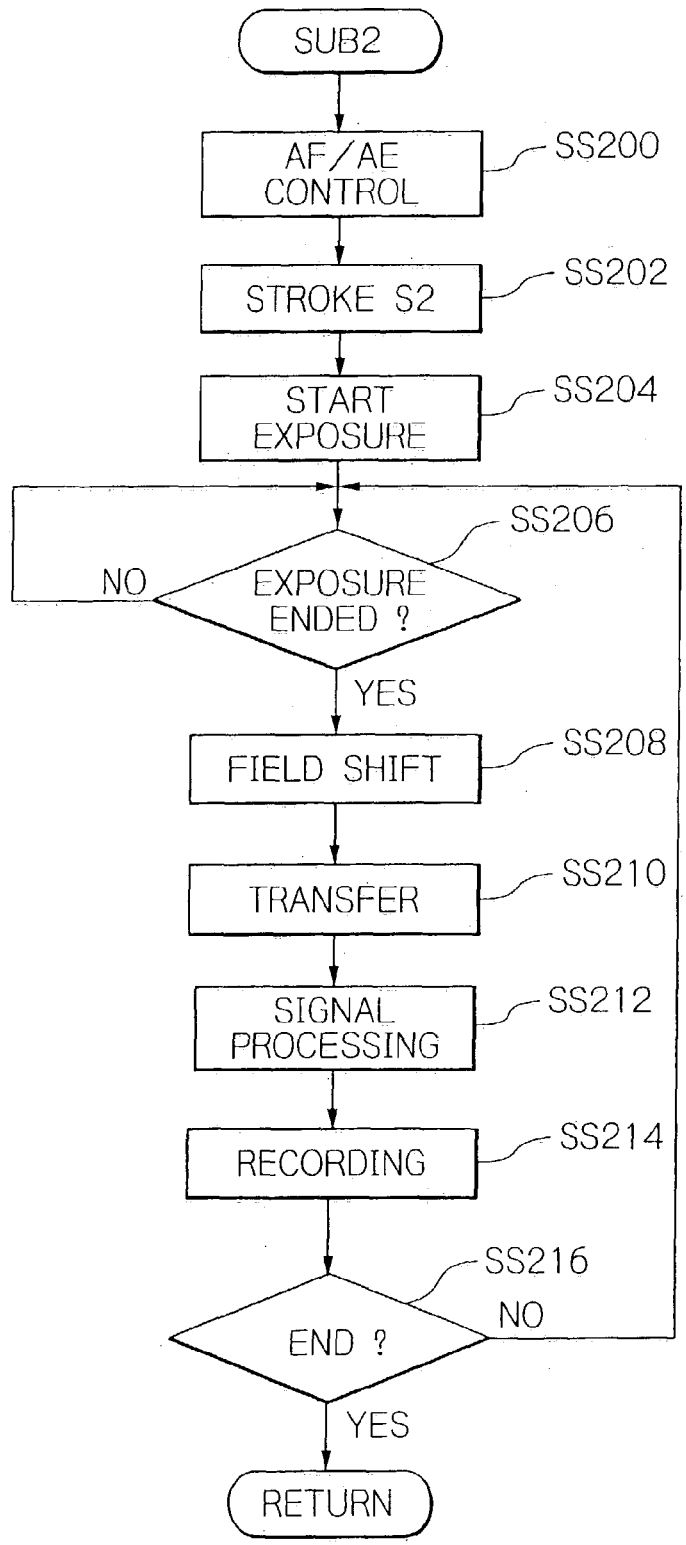
FIG. 11 is a flowchart demonstrating a subroutine transferred to and from the main routine shown in FIG. 7 and executed in a movie mode.

Reference will be made to FIG. 11 for describing the subroutine SUB2 also particular to the illustrative embodiment and relating to the movie mode. The movie mode operation is effected when the through picture display is underway, as stated previously. Therefore, as shown in FIG. 11, AF/AE control is executed first on the transition to the movie mode (substep SS200). As for AF/AE photometry, the system controller 20 causes pixel data or information of different degrees of sensitivity to be read out line by line while being vertically thinned out in the same manner as in the camera mode.

When the operator pushes the shutter release button of the control panel 22 into the second stroke S2 to the full-depth position at any desired timing (substep SS202), the shutter release button is encoded to deliver the trigger signal 22b to the system controller 20. In response, the system controller 20 commands the image pickup section 12 to execute actual pickup in the movie mode and start exposure (substep SS204). More specifically, the driver 26 feeds, under the control of the system controller 20, the drive signal 26c to the image pickup section 12 so as to maintain the mechanical shutter in its open position. Further, the driver 26 feeds electronic shutter pulses to the image pickup section 12 at predetermined intervals for thereby sweeping out signal charges. Subsequently, the driver drives the electronic shutter with the drive signal 26d to open, so that exposure begins. The system controller 20 controls the exposure period of time as well in accordance with the resulting integrated values 18a.

After the substep SS204, the system controller 20 determines whether or not the exposure time has expired (substep SS206). If the answer of the substep SS206 is NO, then the system controller 20 repeats the substep SS206. If the answer of the substep SS206 is YES, then the system controller 20 executes exposure ending procedure (substep SS208).

In the substep SS208, the driver 26 feeds, under the control of the system controller 20, the drive signal 26d to the image pickup section 12 with the result that signal charges are read out to the vertical transfer registers 122. At this instant, signal charges may be read out from the main and subregions 120b and 120c at the same time while being mixed together or may be read out only from the main regions 120b, as desired. Alternatively, when luminance data produced by photometry take a value higher than the reference value, signal charges may read out only from the subregions 120c, as stated in relation to the camera mode.

After the substep S208, the signal charges are transferred toward the horizontal registers via the vertical transfer registers 122 while being thinned out to, e.g. one-fourth (substep SS210). As a result, the signal charges on the lines of the same color are mixed together in the vertical direction. Further, the signal charges are transferred to the horizontal transfer register by line shift in a horizontal blanking period. Consequently, the signal charges are transduced into analog voltage signals 12c by the output amplifier to be input to the preprocessor 16. The preprocessor 16 transforms the analog voltage signals 12c to digital signals 16a and delivers the digital signals 16a to the signal processor 18. The signal processor 18 writes the digital signals or image data 16a in its memory.

Subsequently, the signal processor 18 executes signal processing on the image data 16a thus stored in the memory (substep SS212). First, the signal processor 18 executes, gamma correction, pixel interpolation, matrix processing and compression with the image data 16a, which have been read out from the image sensor 12a, FIG. 2, while being thinned out to, e.g. one-third in the horizontal direction. In the movie mode, as distinguished from the camera mode, pixel interpolation is executed in exactly the same sequence as with the conventional honeycomb pixel pattern except that interpolation for virtual pixels is not executed due to image data for virtual pixels being already obtained. Compression is effected in accordance with, e.g. the MPEG-1 or MPEG-2 standard.

The image data 18b compressed in the step SS212 are stored into the storage 30 (substep SS214). Substantially at the same time, signal processor 18 may feed the monitor 28 with the image data resultant from thinning out the uncompressed image data in the horizontal direction, so that the resultant image data are displayed on the monitor 28 in the form of a movie.

Subsequently, the system controller 20 determines whether or not to end the movie mode (substep SS216). If the answer of the substep SS216 is YES, meaning that the shutter release button is again pressed in the second stroke S2 or that the storage sites are not left in the memory, the system controller 20 outputs the control signals 20a, 20b and 20c that end in response to the trigger signal 22b or the vacant storage sites determined. At this instant, the system controller 20 may continue the through picture display although stopping recording the movie in the storage 30. Subsequently, the subroutine SUB2 returns the control to the main routine, FIG. 7. If the answer of the substep SS216 is NO, then the procedure returns to the substep SS206.

In summary, signal charges are read out from the divided regions of the photosensitive cells 120 in accordance with the pickup mode and exposure conditions such that image data horizontally thinned out by the signal processor 18 in consideration of the color pattern of the color filter segments match with the color pattern. This allows a movie to be picked up at timing matching with the desired standard.

It is to be noted that the image sensor 12a may be configured to execute uneven horizontal thinning in place of even horizontal thinning described above.

As stated above, in the illustrative embodiment, the photosensitive area of the individual photosensitive cell 120 is partitioned into the main and subregions 120b and 120c by the boundary region 120a. The subregion 120c is extended to include the position of a virtual pixel. The light-screening layer 124 covers the photosensitive area except for the optical openings 126 and 128 cut correspondingly to the main and subregions 120b and 120c, respectively. In this configuration, spatial information can be attained not only from an actual pixel corresponding to the main region 120b but also from the optical opening 128, which is an actual pixel located at the position of a virtual pixel. Further, signal charges stored in the main and subregions 120b and 120c can be respectively read out to the vertical transfer register 122 through the read gates 120d and 120e assigned to the subregions 120b and 120c.

The illustrative embodiment with the image sensor 12a obviates the need for the estimation of pixel data heretofore executed at the positions of virtual pixels in accordance with the honeycomb pixel arrangement, thereby reducing load on signal processing in the system. Also, because virtual pixels are replaced with actual pixels, even an oblique boundary can be accurately rendered without resorting to calculations. This reduces false signals to appear in a picture for thereby essentially enhancing resolution.

In the AE/AF photometry mode, the control may be adapted such that signal charges are readout from the main and subregions 120b and 120c in the even- and odd-numbered lines, respectively, with vertical thinning, thereby rendering one time of photometry to obtain two sets of horizontal lines different in sensitivity from each other. At this instant, if two lines adjacent each other are paired into a single line, then a broad dynamic range is achieved. In addition, when a picture is determined to be of high luminance by the AE control, signal charges may be read out only from the subregions 120c in order to prevent the picture data from being saturated with the highlighted portions of the picture viewed white.

Despite that the individual photosensitive cell 120 is divided into the main and subregions 120b and 120c, the mixture of signal charges in the vertical direction can be effected in, e.g. the movie mode in such a manner as to avoid the mixture of colors, contributing a great deal to rapid read-out of signal charges.

In the camera mode, signal charges are read out from the main regions 120b prior to the subregions 120c in consideration of the attenuation of the saturated amount ascribable after shut from light. This enables the signal charges to be accurately read but and implement a faithful picture.

At virtual pixels, spatial information different from the spatial information of the main regions 120b is obtained as pixel data without any estimation, as stated earlier. By using pixel data of such spatial information, it is possible to render a faithful contour of subjects in a picture free form a gray zone even when the picture includes an oblique boundary between a white and a black portion. Even in a color picture, false signals can be reduced to enhance color resolution by effectively using the subregions 120c.

Moreover, the omission of calculations based on estimation not only reduces load on signal processing, but also saves power.

The entire disclosure of Japanese patent application No. 2002-237422 filed on Aug. 16, 2002, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A solid-state image pickup apparatus comprising:
photosensitive cells arranged in a bidemensional array for converting incident light to signal charges, a plurality of vertical transfer registers arranged to transfer the signal charges in a vertical direction, and a horizontal transfer register disposed perpendicularly to said plurality of vertical transfer registers for transferring the signal charges input from said plurality of vertical transfer registers in a horizontal direction;

said photosensitive cells close to given one of said photosensitive cells being shifted from said one photosensitive cell by substantially half a pitch defined by a distance between the photosensitive cells adjoining each other in the vertical and horizontal directions;

each of said plurality of vertical transfer registers being formed zigzag between said photosensitive cells adjoining each other in the horizontal direction;

a solid-state image sensor configured such that, assuming that each of said photosensitive cells actually present is an actual pixel while a virtual photosensitive cell in a vacant region surrounded by said actual pixels is a virtual pixel, then a photosensitive region for photoelectrically transducing light incident to one of said single actual pixels is divided, in a direction in which said virtual pixel is positioned, into a main region and a subregion having a relatively larger area and a relatively smaller area, respectively, said subregion extending to at least a position of said virtual pixel;

said vertical transfer registers and said horizontal transfer register being screened from light except for a first optical opening corresponding to said main region and a second optical opening corresponding to said subregion and including a position of said virtual pixel;

said main region and said subregion being provided with respective read gates for reading out the signal charges from said main region and said subregion either separately or simultaneously;

a timing signal generator for generating timing signals for driving said read gates either separately or simultaneously;

a driver for delivering drive signals to said solid-state image sensor in response to the timing signals; and a system controller for controlling said timing signal generator in accordance with operator's manipulation.

2. The apparatus in accordance with claim 1, wherein said solid-state image sensor comprises color filter segments, each of which is positioned between particular one of said photosensitive cells and a focusing member assigned to said one photosensitive cell;

said color filter segments corresponding to said second optical openings having a color selected from a group consisting of green, transparent, or a color identical with a color of one of said color filter segments which is assigned to said first optical opening.

3. The apparatus in accordance with claim 2, wherein said first optical opening has a larger opening ratio than said second optical opening with respect to the photosensitive area.

4. The apparatus in accordance with claim 3, wherein said focusing member is formed in dependence upon a size of said first optical opening or said second optical opening.

5. The apparatus in accordance with claim 2, wherein the color filter segments assigned to said first optical opening are identical in color with said second optical opening, said system controller controlling, in a movie mode for effecting image pickup at predetermined intervals, said timing signal generator to cause the signal charges generated from said main region and said subregion to be read out while being mixed together.

6. The apparatus in accordance with claim 2, wherein the color filter segments assigned to said first optical opening are identical in color with said second optical opening, said system controller controlling, in a movie mode for effecting image pickup at predetermined intervals, said timing signal generator to cause the signal charges generated from said main region and said subregion to be read out while being mixed together.

7. The apparatus in accordance with claim 4, wherein the color filter segments assigned to said first optical opening are identical in color with said second optical opening, said system controller controlling, in a movie mode for effecting image pickup at predetermined intervals, said timing signal generator to cause the signal charges generated from said main region and said subregion to be read out while being mixed together.

8. The apparatus in accordance with claim 1, wherein said system controller controls said timing signal generator to cause, when photometry is executed with light incident to said solid-state image sensor, the signal charge to be read out only from said subregion in accordance with a photometric value larger than a predetermined luminance value.

9. The apparatus in accordance with claim 2, wherein said system controller controls said timing signal generator to cause, when photometry is executed with light incident to said solid-state image sensor, the signal charge to be read out only from said subregion in accordance with a photometric value larger than a predetermined luminance value.

10. The apparatus in accordance with claim 7, wherein said system controller controls said timing signal generator to cause, when photometry is executed with light incident to said solid-state image sensor, the signal charge to be read out only from said subregion in accordance with a photometric value larger than a predetermined luminance value.

11. The apparatus in accordance with claim 1, wherein said system controller causes said timing signal generator to designate, in accordance with preliminary image pickup for executing photometry with incident light, a line on which the signal charge should be read out from said main region and a line on which the signal charge should be read out from said subregion.

12. The apparatus in accordance with claim 2, wherein said system controller causes said timing signal generator to designate, in accordance with preliminary pickup for executing photometry with incident light, a line on which the signal charge should be read out from said main region and a line on which the signal charge should be read out from said subregion.

13. The apparatus in accordance with claim 5, wherein said system controller causes said timing signal generator to designate, in accordance with preliminary pickup for executing photometry with incident light, a line on which the signal charge should be read out from said main region and a line on which the signal charge should be read out from said subregion.

14. The apparatus in accordance with claim 6, wherein said system controller causes said timing signal generator to designate, in accordance with preliminary pickup for executing photometry with incident light, a line on which the signal charge should be read out from said main region and a line on which the signal charge should be read out from said subregion.

15. The apparatus in accordance with claim 10, wherein said system controller causes said timing signal generator to designate, in accordance with preliminary pickup for executing photometry with incident light, a line on which the signal charge should be read out from said main region and a line on which the signal charge should be read out from said subregion.

16. The apparatus in accordance with claim 1, wherein said system controller controls, in a camera mode for producing a still picture from incident light, said timing signal generator to cause the signal charge of said main region and the signal charge of said subregion to be sequentially read out in this order.

17. The apparatus in accordance with claim 2, wherein said system controller controls, in a camera mode for producing a still picture from incident light, said timing signal generator to cause the signal charge of said main region and the signal charge of said subregion to be sequentially read out in this order.

18. The apparatus in accordance with claim 3, wherein said system controller controls, in a camera mode for producing a still picture from incident light, said timing signal generator to cause the signal charge of said main region and the signal charge of said subregion to be sequentially read out in this order.

19. The apparatus in accordance with claim 4, wherein said system controller controls, in a camera mode for producing a still picture from incident light, said timing signal generator to cause the signal charge of said main region and the signal charge of said subregion to be sequentially read out in this order.

20. The apparatus in accordance with claim 15, said system controller controls, in a camera mode for producing a still picture from incident light, said timing signal generator to cause the signal charge of said main region and the signal charge of said subregion to be sequentially read out in this order.

21. The apparatus in accordance with claim 20, wherein a particular focusing member is assigned to each of said first optical opening and said second optical opening.

22. A solid-state image sensor comprising:
photosensitive cells arranged in a bidemensional array for converting incident light to signal charges;
a plurality of vertical transfer registers arranged to transfer the signal charges in a vertical direction;
a plurality of horizontal transfer register disposed perpendicularly to said plurality of vertical transfer registers for transferring the signal charges input from said plurality of vertical transfer registers in a horizontal direction;
said photosensitive cells close to given one of said photosensitive cells being shifted from said one photosensitive cell by substantially half a pitch defined by a distance between the photosensitive cells adjoining each other in the vertical and horizontal directions;
each of said plurality of vertical transfer registers being formed zigzag between said photosensitive cells adjoining each other in the horizontal direction;
each of said photosensitive cells having a photosensitive region for electrically transducing light incident to an actual pixel, at which one of said photosensitive cells is actually present, each of said photosensitive regions being divided into a main region and a subregion having a relatively larger area and a relatively smaller area, respectively, in a direction in which a virtual pixel is positioned, which is a virtual photosensitive cell in a vacant region surrounded by said actual pixels, said subregion extending to at least a position of said virtual pixel;
a light-screening layer for screening incident light, said layer being formed on said vertical transfer registers and said horizontal transfer registers except for a first optical opening corresponding to said main region and a second optical opening corresponding to said subregion and including a position of said virtual pixel; and
read gates respectively formed in said main region and said subregion for reading out the signal charges from said main region and said subregion either separately or simultaneously.

23. The sensor in accordance with claim 22, wherein each of color filter segments is positioned between particular one of said photosensitive cells and a focusing member assigned to said one photosensitive cell;
said color filter segments corresponding to said second optical openings having a color selected from a group consisting of green, transparent, or a color identical with a color of one of said color filter segments which is assigned to said first optical opening.

24. The sensor in accordance with claim 22, wherein said first optical opening has a larger opening ratio than said second optical opening with respect to the photosensitive area.

25. The sensor in accordance with claim 23, wherein said first optical opening has a larger opening ratio than said second optical opening with respect to the photosensitive area.

26. The sensor in accordance with claim 22, further comprising focusing members each being assigned to respective one of said first optical opening and said second optical opening of each of said photosensitive cells for focusing incident light.

27. The sensor in accordance with claim 23, further comprising focusing members each being assigned to respective one of said first optical opening and said second optical opening of each of said photosensitive cells for focusing incident light.

28. The sensor in accordance with claim 24, further comprising focusing members each being assigned to respective one of said first optical opening and said second optical opening of each of said photosensitive cells for focusing incident light.

29. The sensor in accordance with claim 28, wherein said focusing member is formed in dependence upon a size of said first optical opening or said second optical opening.

* * * * *